United States Patent [19]

Zobel

[11] Patent Number: 5,184,028
[45] Date of Patent: Feb. 2, 1993

[54] CURRENT COMPENSATING CHARGE PUMP CIRCUIT

[75] Inventor: Don W. Zobel, Miami, Ariz.

[73] Assignee: Motorola, Inc., Schaumburg, Ill.

[21] Appl. No.: 898,998

[22] Filed: Jun. 15, 1992

[51] Int. Cl.$^5$ .......................... H03K 3/01; H03K 5/22
[52] U.S. Cl. .................................. 307/270; 307/296.1;
307/264; 307/355; 307/364
[58] Field of Search ................. 307/270, 296.1, 296.8,
307/607, 264, 355, 364

[56] References Cited
U.S. PATENT DOCUMENTS 4,922,131  5/1990  Anderson et al. ................. 307/355
4,975,596  12/1990  Thomas et al. ..................... 307/355

*Primary Examiner*—William L. Sikes
*Assistant Examiner*—Margaret Rose Wambach
*Attorney, Agent, or Firm*—Bradley J. Botsch, Sr.

[57] ABSTRACT

A charge pump circuit (10) has been provided for maintaining the currents sunk by each of the bottom current sources (12, 14) substantially equal to the current sourced from a first upper current source (16). The present invention maintains the voltage across a second upper current source (64) that determines the current for the lower current sources to be modified with respect to corresponding changes in the first upper current source wherein these changes in the first upper current source are due to a varying voltage occurring at the output (18) of the charge pump circuit.

7 Claims, 1 Drawing Sheet

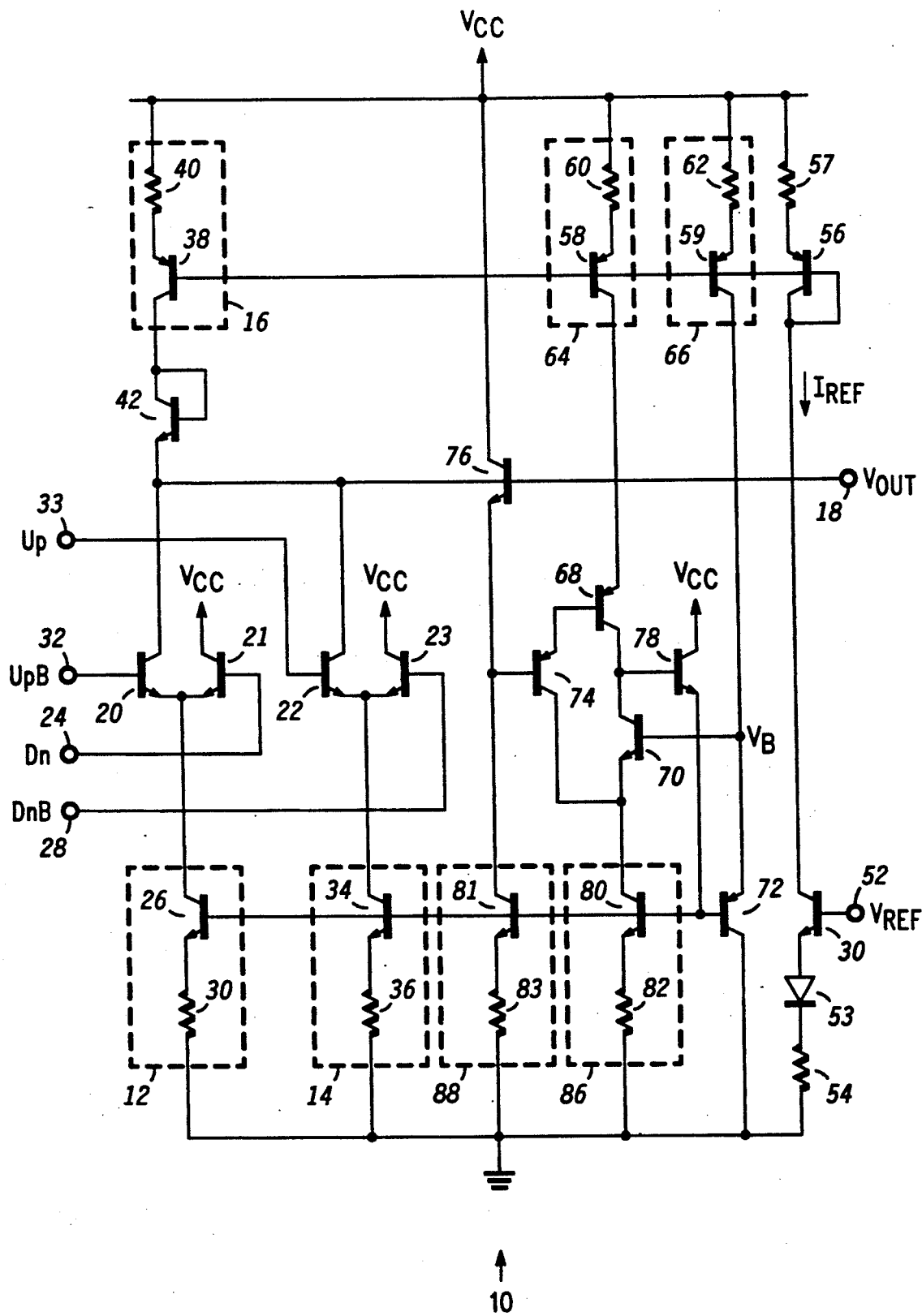

CURRENT COMPENSATING CHARGE PUMP CIRCUIT

FIELD OF THE INVENTION

This invention relates to charge pump circuits and, in particular, to modulating a pull down current source substantially the same as a pull up current source thereby achieving a net current error of substantially zero at an output of a charge pump circuit.

BACKGROUND OF THE INVENTION

Charge pump circuits are typically utilized in voltage controlled oscillator (VCO) applications wherein the charge pump circuit is responsive to Up and Down input signals to provide a current at the output of the charge pump that is used to either increase or decrease a voltage across a capacitor that is typically coupled to the output of the charge pump wherein it is understood that the voltage across the capacitor controls the frequency of oscillation of the VCO.

Charge pump circuits typically include at least three current sources; a first current source that is always on and has its output coupled to source current to the output of the charge pump; and second and third switched current sources which both have their outputs coupled to sink current from the output of the charge pump.

In general, a charge pump can essentially operate in three different modes. The first mode is when the second and third current sources are disabled such that the first current source sources current to the output of the charge pump thereby increasing the voltage across an external capacitor that is typically coupled to the output of the charge pump. A second mode is when the second current source is enabled while the third current source is disabled such that the second current source cancels the current sourced from the first current source thereby providing a zero current source at the output of the charge pump. Finally, a third mode is when both the second and third switched current sources are enabled such that one of the current sources cancels the current sourced from the first current source and the other current source then sinks a predetermined current from the output of the charge pump thereby decreasing the voltage across the external capacitor.

One problem with the above described charge pump is that as the voltage at the output of the charge pump varies, the current sourced from the first current source also varies because its output is coupled to the output of the charge pump. However, the current sunk from the second and third current sources do not vary. As a result, this leads to error currents appearing at the output of the charge pump which can eventually cause timing and phase errors within a phase-locked loop.

One method to decrease this net current error is to increase the value of the resistor in the emitter leg of the PNP transistor of the first current source. This has the effect of making the change in the base-emitter voltage of the PNP transistor a smaller percentage of the total voltage across the resistor. However, this solution limits the overall operating range of the charge pump, and does not account for the alpha changes of the PNP transistor wherein as the collector-emitter voltage of the transistor changes, the alpha of the transistor also changes which subsequently causes a change in the collector current of the transistor.

Hence, there exists a need for an improved charge pump circuit that adjusts the lower pull down current sources to reflect the current changes of the pull up current source which are due to a changing voltage at the output voltage of the charge pump.

SUMMARY OF THE INVENTION

Briefly, there is provided a charge pump circuit.

The present invention will be better understood from the following detailed description taken in conjunction with the accompanying drawing.

BRIEF DESCRIPTION OF THE DRAWING

The sole FIGURE is a detailed schematic drawing illustrating a charge pump circuit for adjusting lower pull down current sources for changes occurring in the current of an upper pull up current source.

DETAILED DESCRIPTION OF THE DRAWING

Referring to the sole FIGURE, a detailed schematic diagram illustrating charge pump circuit 10 for adjusting lower pull down current sources 12 and 14 with respect to changes in the current sourced from upper pull up current source 16 which occur as a result of varying voltages at output terminal 18.

Charge pump circuit 10 further includes circuitry for alternately enabling and disabling current sources 12 and 14 wherein a first differential pair of transistors comprised of transistors 20 and 21 is utilized to alternately enable and disable current source 12, while and a second pair of differential transistors comprised of transistors 22 and 23 is used to alternately enable and disable current source 14. In particular, transistor 20 has a collector coupled to terminal 18 and a base coupled to terminal 24 for receiving signal Dn. The emitter of transistor 20 is coupled to the emitter of transistor 21 both of which are coupled to the collector of the transistor 26. The collector of transistor 21 is coupled to a first supply voltage terminal at which the operating potential $V_{CC}$ is applied, and the base of transistor 21 is coupled to terminal 28 at which the signal DnB is applied. It is understood that signals Dn and DnB comprise a differential signal wherein signal Dn is the non-inverting signal and DnB is the inverting signal. The emitter of transistor 26 is returned to ground reference via resistor 30 wherein transistor 26 and resistor 30 comprise pull down current source 12.

Referring now to the second differential pair, transistor 22 has a collector coupled to terminal 18 and a base coupled to terminal 32 for receiving signal UpB. The collector of transistor 23 is coupled to operating potential $V_{CC}$ while the base of transistor 23 is coupled to terminal 33 at which the signal Up is applied. Likewise, it is understood that signals Up and UpB comprise a differential signal wherein signal Up is the non-inverting signal and UpB is the inverting signal. The emitters of transistors 22 and 23 are both coupled to the collector of transistor 34, the latter having an emitter returned to ground via resistor 36 wherein transistor 34 and resistor 36 comprise pull down current source 14.

Upper pull up current source 16 includes PNP transistor 38 which has an emitter coupled to operating potential $V_{CC}$ via resistor 40, and a collector coupled to the collector and base of diode-connected transistor 42. Further, the emitter of transistor 42 is coupled to terminal 18.

Transistor 50 has a base coupled to terminal 52 at which the reference voltage $V_{REF}$ is applied, and an emitter returned to ground via serially-coupled diode 53 and resistor 54. The collector of transistor 50 is coupled to the collector of transistor 56 the latter having an emitter coupled to operating potential $V_{CC}$ via resistor 57. In essence, transistor 50 along with reference voltage $V_{REF}$ sets up a predetermined reference current ($I_{REF}$) through transistor 50 which also flows through transistor 56. Further, current $I_{REF}$ is subsequently mirrored to transistors 38, 58 and 59 in a well known manner by maintaining the base-emitter voltages substantially equal wherein the bases of transistors 38, 58 and 59 are coupled to the base of transistor 56 and resistors 40, 57, 62, 64 are substantially equal or may be adjusted to compensate for mismatches. The emitter of transistor 58 is coupled to operating potential $V_{CC}$ via resistor 60. Likewise, the emitter of transistor 59 is coupled to operating potential $V_{CC}$ via resistor 62. It is understood that components 58 and 60 comprise an upper current source as denoted by reference number 64, and components 59 and 62 comprise an upper current source as denoted by reference number 66.

The collector of transistor 58 is coupled to the emitter of transistor 68, while the collector of transistor 59 is coupled to the base of transistor 70 and the emitter of transistor 72. The base of transistor 68 is coupled to the emitter of transistor 74, the latter having a base coupled to the emitter of transistor 76. The collector of transistor 68 is coupled to the base of transistor 78, and to the collector of transistor 70. The collector of transistor 74 is coupled to the emitter of transistor 70, while the collector of transistor 76 is coupled to operating potential $V_{CC}$. The collector of transistor 78 is coupled to operating potential $V_{CC}$, and the emitter of transistor 78 is coupled to drive base current into the bases of transistors 72, 80, 81, 34 and 26.

The collector of transistor 72 is returned to ground, while the emitters of transistors 80 and 81 are returned to ground via resistors 82 and 83, respectively. The collector of transistor 80 is coupled to the emitter of transistor 70, while the collector of transistor 81 is coupled to the emitter of transistor 76. It is understood that components 80 and 82 form a lower current source as denoted by reference number 86, while components 81 and 83 form a lower current source as denoted by reference number 88.

In operation, current source 16 is always rendered operative for sourcing current to output terminal 18. However, bottom current sources 12 and 14 can be alternately enabled or disabled from sinking current from output terminal 18 via transistors 20-23. Charge pump circuit 10 can operate in one of three modes. In a first mode of operation, differential signals Dn and DnB render transistor 21 operative and transistor 20 non-operative thereby disabling bottom current source 12 from sinking current from output terminal 18. Further, differential signals Up and UpB render transistor 22 non-operative and transistor 23 operative thereby disabling bottom current source 14 from sinking current from output terminal 18. As a result, current source 16 sources a predetermined amount of current to output terminal 18. This will have the effect of increasing a voltage across an external capacitor (not shown) that is typically coupled to output terminal 18 which may be the input of a VCO (not shown) and all part of a phase-locked loop (not shown).

In a second mode of operation, transistor 22 is rendered non-operative while transistor 23 is rendered operative via signals Up and UpB thereby disabling current source 14 from sinking current from output terminal 18. However, signals Dn and DnB now render transistor 20 operative and transistor 21 non-operative thereby enabling current source 12 to sink current from output terminal 18 thereby cancelling the current provided from upper current source 16. As a result, assuming that current source 16 sources substantially the same current that current source 12 sinks, the resulting current appearing at terminal 18 is ideally zero.

Finally, in the third mode of operation, transistor 20 is rendered operative via signals Dn and DnB as well as transistor 22 via signals Up and UpB thereby enabling both bottom current sources 12 and 14 to sink current from terminal 18. One of the bottom current sources will act to cancel out the effect of upper current source 16 as described for the second mode of operation, while the other one of the bottom current sources will function to sink a predetermined current from output terminal 18. Thus will have the effect of decreasing the voltage across the external capacitor.

As noted earlier, the reference current flowing through transistor 56 is mirrored through transistors 38, 58 and 59 thereby initially providing current $I_{REF}$ at the collectors of transistors 38, 58 and 59. However, it must be understood that if the voltage at terminal 18 changes, the voltage at the collector of transistor 38 will also vary since it is directly coupled to output terminal 18 via a diode drop due to transistor 42. This has the effect of changing the collector-emitter voltage ($V_{CE}$) of transistor 38 thereby changing the current flowing through transistor 38. Therefore, it is imperative that the collector-emitter voltages of transistors 38 and 58 remain substantially equal so as to maintain matched upper and lower current sources. That is, in order to obtain very low net current errors at output terminal 18, it is imperative that the current sunk by current source 12 (or current source 14 which are the same) is substantially equal to the current sourced by current source 16. Thus, if the current through transistor 38 changes, the currents through transistors 26 and 34 must correspondingly change.

The present invention achieves such a result via circuitry including diode-connected transistor 42 and level shift transistors 76, 74 and 68 wherein the present invention maintains the voltage at the collector of transistor 58 to be substantially equal to the voltage at the collector of transistor 38. In particular, the voltage at the collector of transistor 58 is up a base-emitter voltage with respect to the voltage at terminal 18 via transistors 76, 74 and 68. Likewise, the voltage at the collector of transistor 38 is also up a base-emitter voltage via transistor 42 with respect to the voltage appearing at terminal 18.

Thus, the present invention provides a charge pump circuit such that when the voltage at terminal 18 changes, the voltage across transistors 38 and 58 change substantially the same with respect to one another. In other words, the present invention provides a charge pump circuit that modifies the collector-emitter voltage of transistor 58 in the same manner that the collector-emitter voltage of transistor 38 is modified as a result of a changing voltage appearing at output terminal 18.

Moreover, the present invention provides that the collector current flowing through transistor 38 is substantially equal to the collector current flowing through transistor 58 wherein the current flowing through transistor 58 is utilized to set the current of the bottom current sources 12 and 14 via transistor 80 which mirrors its current to transistors 26 and 34. As a result, the current source from current source 16 will be substantially equal to the current sunk by current source 12, and the current source from current source 16 will be substantially equal to the current sunk by current source 14.

Additionally, current source 88 is used to generate a bias current to bias up level shift transistor 76. Further, transistor 72 provides a bias point for cascode transistor 70 by providing voltage $V_B$ at the base of transistor 70. Also, transistor 78 drives base current to the bias line for driving transistors 26, 34, 72, 81 and 80.

Transistor 70 compensates for the inherent base current error occurring in the first and second differential pair of transistors (transistors 20-23) by injecting a base current at the collector of transistor 80 which is essentially added to the collector current of transistor 58.

By now it should be apparent from the foregoing discussion that a novel charge pump circuit has been provided for maintaining the currents sunk by each of the bottom current sources substantially equal to the current sourced from a first upper current source. The present invention maintains the voltage across a second upper current source that determines the current for the lower current sources to be modified with respect to corresponding changes in the first upper current source wherein these changes in the first upper current source are due to a varying voltage occurring at the output of the charge pump circuit.

While the invention has been described in conjunction with specific embodiments thereof, it is evident that many alternations, modifications and variations will be apparent to those skilled in the art in light of the foregoing description. Accordingly, it is intended to embrace all such alternations, modifications and variations in the appended claims.

I claim:

1. A charge pump circuit (10) for providing an output voltage ($V_{OUT}$) at an output terminal (18), comprising:
    a reference circuit responsive to a reference voltage ($V_{REF}$) for providing a reference current;
    a first pull up current source (16) having first and second terminals and a control terminal, said first terminal of said first pull up current source being coupled to a first supply voltage terminal ($V_{CC}$), said control terminal of said first pull up current source being coupled to said reference circuit;
    a second pull up current source (64) having first and second terminals and a control terminal, said first terminal of said second pull up current source being coupled to said first supply voltage terminal, said control terminal of said second pull up current source being coupled to said reference circuit;
    a first pull down current source (12) having first and second terminals and a control terminal, said second terminal of said first pull down current source being coupled to a second supply voltage terminal (GRD), said control terminal of said first pull down current source being coupled to a bias line for applying a voltage thereto;
    a second pull down current source (14) having first and second terminals and a control terminal, said second terminal of said second pull down current source being coupled to said second supply voltage terminal, said control terminal of said second pull down current source being coupled to said control terminal of said first pull down current source;
    a third pull down current source (86) having first and second terminals and a control terminal, said second terminal of said third pull down current source being coupled to said second supply voltage terminal, said control terminal of said third pull down current source being coupled to said control terminal of said second pull down current source;
    a first switch (20, 21) coupled between said first terminal of said first pull down current source and the output terminal, said first switch being responsive to a first differential input signal for alternately enabling and disabling said first pull down current source;
    a second switch (22, 23) coupled between said first terminal of said second pull down current source and the output terminal, said second switch being responsive to a second differential input signal for alternately enabling and disabling said second pull down current source; and
    circuit means coupled to said second terminal of said first pull up current source, to the output terminal, to said second terminal of said second pull up current source, and to said first terminal of said third pull down current source for maintaining a voltage across said second pull up current source to be substantially equal to a voltage across said first pull up current source thereby allowing a current through said second pull up current source to remain substantially equal to a current through said first pull up current source due to a voltage change occurring at the output terminal.

2. The charge pump circuit according to claim 1 wherein said circuit means includes a diode connected transistor (42) coupled between said second terminal of said first pull up current source and the output terminal wherein an anode of said diode connected transistor is coupled to said second terminal of said first pull up current source and a cathode of said diode connected transistor is coupled to the output terminal.

3. The charge pump circuit according to claim 1 wherein said circuit means includes:
    a first transistor (76) having a collector, base and an emitter, said collector of said first transistor being coupled to said first supply voltage terminal, said base of said first transistor being coupled to the output terminal, said emitter of said first transistor being coupled to receive a bias current;
    a second transistor (74) having a collector, a base and an emitter, said base of said second transistor being coupled to said emitter of said first transistor, said collector of said second transistor being coupled to said first terminal of said third pull down current source; and
    a third transistor (68) having a collector, a base and an emitter, said collector of said third transistor being coupled to said collector of said second transistor, said base of said third transistor being coupled to said emitter of said second transistor, said emitter of said third transistor being coupled to said second terminal of said second pull up current source.

4. The charge pump circuit according to claim 3 further including a fourth transistor (70) having a collector, a base and an emitter, said collector of said fourth transistor being coupled to said collector of said third transistor, said base of said fourth transistor being coupled to receive a bias voltage, and said emitter of said fourth transistor being coupled to said collector of said second transistor.

5. The charge pump circuit according to claim 4 further including a fifth transistor (78) having a collector, a base and an emitter, said collector of said fifth transistor being coupled to said first supply voltage terminal, said base of said fifth transistor being coupled to collector of said fourth transistor, and said emitter of said fifth transistor being coupled to said control terminal of said first pull down current source.

6. A charge pump circuit (10) for providing an output voltage ($V_{OUT}$) at an output terminal (18), the charge pump circuit having a first pull up current source (16) which is coupled between a first supply voltage terminal ($V_{CC}$) and the output terminal, first and second switched pull down current sources (12, 14) both of which are parallel coupled between the output terminal and a second supply voltage terminal (GRD), the charge pump circuit comprising:

a diode connected transistor (42) coupled between the first pull up current source and the output terminal wherein an anode of said diode connected transistor is coupled to the first pull up current source and a cathode of said diode connected transistor is coupled to the output terminal;

a first level shift transistor (76) having a collector, base and an emitter, said collector of said first level shift transistor being coupled to said first supply voltage terminal, said base of said first level shift transistor being coupled to the output terminal;

a second level shift transistor (74) having a collector, a base and an emitter, said base of said second level shift transistor being coupled to said emitter of said first level shift transistor;

a third level shift transistor (68) having a collector, a base and an emitter, said base of said third level shift transistor being coupled to said emitter of said second level shift transistor;

an second pull up current source (64) being coupled between said first supply voltage terminal and said emitter of said third level shift transistor;

a first transistor (70) having a collector, a base and an emitter, said collector of said first transistor being coupled to said collector of said third level shift transistor, said base of said first transistor being coupled to receive a bias voltage, and said emitter of said first transistor being coupled to said collector of said second level shift transistor;

a third pull down current source (86) being coupled between said collector of said second level shift transistor and said second supply voltage terminal;

a fourth pull down current source (88) being coupled between said emitter of said first level shift transistor and said second supply voltage terminal for generating a bias current to bias said first level shift transistor; and said diode connected transistor and said first, second and third level shift transistors all function to maintain the voltage across said second pull up current source substantially equal to the voltage across the first pull up current source as a result of varying voltages occurring at the output terminal.

7. A charge pump circuit having differential inputs responsive to differential up and down input signals for providing an output voltage at an output terminal, the charge pump circuit comprising:

(a) a reference current source for providing a reference current, said reference current source including;

(i) a first transistor (57) having a collector, a base and an emitter, said collector of said first transistor being coupled to said base of said first transistor, and said emitter of said first transistor being coupled to a first supply voltage terminal ($V_{CC}$);

(ii) a second transistor (50) having a collector, a base and an emitter, said collector of said first transistor being coupled to said collector of said first transistor, said base of said second transistor being coupled to receive a reference voltage ($V_{REF}$); and (iii) a first resistor (54) being coupled between said emitter of said second transistor and a second supply voltage terminal (GRD);

(b) a first upper current source (16) including a third transistor (38) having a collector, a base and an emitter, said emitter of said third transistor being coupled to said first supply voltage terminal, and said base of said third transistor being coupled to said base of said first transistor;

(c) a second upper current source (64) including a fourth transistor (58) having a collector, a base and an emitter, said base of said fourth transistor being coupled to said base of said first transistor, and said emitter of said fourth transistor being coupled to said first supply voltage terminal;

(d) a first lower current source (12) including a fifth transistor (26) having a collector, a base and an emitter, said emitter of said fifth transistor being coupled to said second supply voltage terminal;

(e) a second lower current source (14) including a sixth transistor (34) having a collector, a base and an emitter, said emitter of said sixth transistor being coupled to said second supply voltage terminal, said base of sixth transistor being coupled to said base of said fifth transistor;

(f) a third lower current source (86) including a seventh transistor (80) having a collector, a base and an emitter, said base of said seventh transistor being coupled to said base of said sixth transistor, and said emitter of said seventh transistor being coupled to said second supply voltage terminal;

(g) a first differential pair of transistors responsive to the differential down input signal for alternately enabling and disabling said first lower current source, said first differential pair of transistors including:

(i) an eighth transistor (20) having a collector, a base and an emitter, said collector of said eighth transistor being coupled to the output terminal, said base of said eighth transistor being coupled to receive a non-inverting differential down input signal; and (ii) a ninth transistor (21) having a collector, a base and an emitter, said collector of said ninth transistor being coupled to said first supply voltage terminal, said base of said ninth transistor being coupled to receive an inverting signal of the differential down input signal, and said emitter of said ninth transistor being coupled to said emitter of said eighth transistor and to said collector of said fifth transistor;

(h) a second differential pair of transistors responsive to the differential up input signal for alternately enabling and disabling said second lower current source, said second differential pair of transistors including:

(i) a tenth transistor (22) having a collector, a base and an emitter, said collector of said tenth transistor being coupled to the output terminal, said base of said tenth being coupled to receive an inverting signal of the differential up input signal; and (ii) an eleventh transistor (23) having a collector, a base and an emitter, said collector of said eleventh transistor being coupled to said first supply voltage terminal, said base of said eleventh transistor being coupled to receive a non-inverting signal of the differential up input signal, and said emitter of said eleventh transistor being coupled to said emitter of said tenth transistor and to said collector of said sixth transistor;

(i) a diode connected transistor (42) having its anode coupled to the collector of said third transistor and its cathode coupled to the output terminal;

(j) a twelfth transistor (76) having a collector, a base and an emitter, said collector of said twelfth transistor being coupled to said first supply voltage terminal, said base of said twelfth transistor being coupled to the output terminal;

(k) a thirteenth transistor (74) having a collector, a base and an emitter, said collector of said thirteenth transistor being coupled to said collector of said seventh transistor, said base of said thirteenth transistor being coupled to said emitter of said twelfth transistor;

(l) a fourteenth transistor (68) having a collector, a base and an emitter, said base of said fourteenth transistor being coupled to said emitter of said thirteenth transistor, and said emitter of said fourteenth transistor being coupled to said collector of said fourth transistor;

(m) a fifteenth transistor (70) having a collector, a base and an emitter, said collector of said fifteenth transistor being coupled to said collector of said fourteenth transistor, said base of said fifteenth transistor being coupled to receive a bias voltage ($V_B$), and said emitter of said fifteenth transistor being coupled to said collector of said thirteenth transistor;

(n) a sixteenth transistor (78) having a collector, a base and an emitter, said collector of said sixteenth transistor being coupled to said first supply voltage terminal, said base of said sixteenth transistor being coupled to said collector of said fifteenth transistor, and said emitter of said sixteenth transistor being coupled to said base of said seventh transistor; and (o) a bias circuit (88) coupled between said emitter of said twelfth transistor and said second supply voltage terminal for providing a bias current for said twelfth transistor.

* * * * *